US012754217B2

(12) United States Patent
Qu et al.

(10) Patent No.: US 12,754,217 B2
(45) Date of Patent: Oct. 6, 2026

(54) CURRENT SENSOR

(71) Applicant: MultiDimension Technology Co., Ltd., Zhangjiagang (CN)

(72) Inventors: Pin Qu, Zhangjiagang (CN); Songsheng Xue, Zhangjiagang (CN); Jiuyuan Zhang, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 194 days.

(21) Appl. No.: 18/699,485

(22) PCT Filed: Sep. 14, 2022

(86) PCT No.: PCT/CN2022/118643
§ 371 (c)(1),
(2) Date: Apr. 8, 2024

(87) PCT Pub. No.: WO2023/056828
PCT Pub. Date: Apr. 13, 2023

(65) Prior Publication Data

US 2024/0410919 A1 Dec. 12, 2024

(30) Foreign Application Priority Data

Oct. 8, 2021 (CN) .......................... 202111171549.3

(51) Int. Cl.
*G01R 15/20* (2006.01)

(52) U.S. Cl.
CPC .................................. *G01R 15/207* (2013.01)

(58) Field of Classification Search
CPC .. G01R 15/207; G01R 15/202; G01R 15/205; G01R 19/0092
See application file for complete search history.

(56) References Cited

U.S. PATENT DOCUMENTS 10,184,960 B2 * 1/2019 Nakayama ............. G01R 19/25
10,746,820 B2 * 8/2020 Lassalle-Balier .... G01R 15/205
(Continued)

FOREIGN PATENT DOCUMENTS

CN 100443903 12/2008
CN 102901858 1/2013
(Continued)

OTHER PUBLICATIONS

"International Application No. PCT CN2022 118643, International Search Report and Written Opinion mailed Nov. 15, 2022", (Nov. 15, 2022), 15 pages.
(Continued)

*Primary Examiner* — Dominic E Hawkins
(74) *Attorney, Agent, or Firm* — Schwegman Lundberg & Woessner, P.A.

(57) ABSTRACT

The embodiments of the present invention disclose a current sensor. The current sensor comprises a current conductor to be measured which comprises a first conductor section and a second conductor section with identical shapes. An area enclosed by the extended shape of the first conductor section and the second conductor section is a U shape, and the two conductor sections are symmetrically distributed about a geometric center line of the current conductor to be measured. A first magnetic sensor group is arranged at one or two sides of the first conductor section. A second magnetic sensor group is also arranged at one or two sides of the first conductor section. These two magnetic sensor groups are symmetrically distributed about the geometric center line of the current conductor to be measured and have the same sensing directions. All sides are enclosed by a shielding cover, and the shielding cover is placed in a housing made of insulating material that wraps the current conductor to be measured, the first magnetic sensor group, the second mag-
(Continued)

netic sensor group, and a signal processor and a circuit board. The current sensor provided by the embodiments of the present invention is small in size, has strong interference immunity, wide measurement range, low temperature drift, high frequency response, and high measurement precision.

7 Claims, 3 Drawing Sheets

(56) References Cited

U.S. PATENT DOCUMENTS

| | | | | |
|---|---|---|---|---|
| 2008/0258721 | A1* | 10/2008 | Guo | B82Y 25/00 324/228 |
| 2017/0010310 | A1* | 1/2017 | Morel | G01R 15/207 |
| 2017/0184636 | A1* | 6/2017 | Racz | G01R 15/202 |

FOREIGN PATENT DOCUMENTS

| | | | | |
|---|---|---|---|---|
| CN | 103487632 | | 1/2014 | |
| CN | 103809008 | | 5/2014 | |
| CN | 105044439 | | 11/2015 | |
| CN | 111562418 | | 8/2020 | |
| CN | 111624386 | | 9/2020 | |
| CN | 111624386 | A * | 9/2020 | G01R 19/0092 |
| CN | 113125832 | | 7/2021 | |
| CN | 213600772 | | 7/2021 | |
| CN | 113917215 | | 1/2022 | |
| JP | 2003090850 | | 3/2003 | |
| JP | 2014055791 | A * | 3/2014 | |
| WO | 2012046547 | | 4/2012 | |
| WO | WO-2012046547 | A1 * | 4/2012 | G01R 15/207 |
| WO | 2023056828 | | 4/2023 | |

OTHER PUBLICATIONS

"Chinese Application No. 202111171549.3, Notification to Grant Patent Right for Invention dated Dec. 1, 2023", English translation only, (Dec. 1, 2023), 2 pages.

"Chinese Application No. 202111171549.3, First Office Action mailed Jan. 20, 2023", with English translation, (Jan. 20, 2023), 14 pages.

"Chinese Application No. 202111171549.3, Second Office Action dated May 16, 2023", English translation only, (May 16, 2023), 10 pages.

"Chinese Application No. 202111171549.3, Third Office Action dated Jul. 25, 2023", English translation only, (Jul. 25, 2023), 10 pages.

* cited by examiner

CURRENT SENSOR

PRIORITY CLAIM TO RELATED APPLICATIONS

This application is a U.S. national stage filing under 35 U.S.C. § 371 from International Application No. PCT/CN2022/118643, filed on 14 Sep. 2022, and published as WO2023/056828 on 13 Apr. 2023, which claims the benefit under 35 U.S.C. 119 to Chinese Application No. 202111171549.3, filed on 8 Oct. 2021, the benefit of priority of each of which is claimed herein, and which applications and publication are hereby incorporated herein by reference in their entirety.

TECHNICAL FIELD

Embodiments of the present invention relate to the field of magnetic sensor technologies, and in particular, to a current sensor.

BACKGROUND ART

For a long time, there has been a widespread and important demand for current sensors in industries such as power systems, wind power, photovoltaics, frequency converters, rail transit, and industrial control. With the booming development of artificial intelligence and the smart Internet of Things, requirements for current sensors will be further increased. Miniaturization, integration, high frequency response, and fast response are directions of the future development of current sensors.

At present, shunts, current transformers, Hall current sensors, and flux gate current sensors that are commonly used for current measurement detect, in different ways, changes in electric fields or magnetic fields generated by a conductor to be measured to achieve current detection. Patent application No. CN200410069833.X discloses a manufacturing method for an open-loop current sensor, and its working principle is using a magnetic field detector placed in an air gap of an iron core to detect magnetic field changes generated by a conductor to be measured, thereby achieving current detection. However, this solution has the following defects: due to the large size of the iron core, the overall size of the current sensor is also relatively large; the cost is high; and high-frequency characteristics are poor, so that the iron core is prone to generate eddy currents under high-frequency components, posing safety risks. Patent application No. CN201210409149.6 discloses a current sensor. The current sensor includes a magnetoresistive integrated chip, an operational amplifier, a resistor, a printed circuit board, and a U-shaped current lead to be measured. A differential magnetic field generated by the U-shaped current lead is detected by the magnetoresistive integrated chip of a full bridge structure, thereby achieving current detection. However, the above current sensor has the following defects: a plurality of soft magnetic layers and compensation lead layers need to be arranged, the process is complex and its requirements are relatively high; and its anti-interference performance is not high. When the current sensor has a large current passing through or there is interference from an external magnetic field of a certain intensity around it, it is easy to cause saturation of one or two bridge arms of the magnetoresistive integrated chip, which affects its measurement precision.

A current transformer, a Hall current sensor, and a flux gate current sensor need to use a magnetic ring structure to amplify the magnetic field and improve the measurement precision, thereby achieving isolated measurement of the current. During current measurement, the measured current conductor needs to pass through the central hole of the magnetic ring, which causes the volume of the measuring device to depend on the sizes of the measured current conductor and the magnetic ring. Meanwhile, the frequency characteristics of the magnetic ring itself severely limit the frequency response characteristics of the measuring device, making it difficult for the measuring device to achieve fast response and high measurement bandwidth. These types of sensors with larger rated currents are bulky, expensive, and cannot be widely used. Moreover, the solutions are rigid, making it difficult to flexibly adapt to different current measurement scenarios.

SUMMARY OF THE INVENTION

The embodiments of the present invention provide a current sensor to solve the problems of existing current sensors such as narrow measurement range, poor high-frequency characteristics, low measurement precision, and large size.

The embodiments of the present invention provide a current sensor, comprising:

- a current conductor to be measured, wherein the current conductor to be measured includes a first conductor section and a second conductor section with identical shapes, the area enclosed by the extended shape of the first conductor section and the second conductor section is a "U" shape, and the first conductor section and the second conductor section are symmetrically distributed around the geometric center line of the current conductor to be measured;
- a first magnetic sensor group and a second magnetic sensor group, wherein the first magnetic sensor group is arranged at one or two sides of the first conductor section, the second magnetic sensor group is arranged at one or two sides of the second conductor section, the first magnetic sensor group and the second magnetic sensor group are symmetrically distributed around the geometric center line of the current conductor to be measured, and the first magnetic sensor group and the second magnetic sensor group have the same sensing direction; and
- a signal processor, a circuit board, and a shielding cover with all sides enclosed, wherein the shielding cover is placed in a housing and encloses the current conductor to be measured, the first magnetic sensor group, the second magnetic sensor group, the signal processor, and the circuit board.

After a current flows through the current conductor to be measured, the first conductor section and the second conductor section generate magnetic fields to be measured respectively at the upper and lower sides in the direction of the geometric center line. The magnetic fields to be measured have the same magnitude and are distributed symmetrically in opposite directions around the geometric center line of the current conductor to be measured. The first magnetic sensor group is used for detecting a first magnetic field to be measured generated by the current flowing through the first conductor section of the current conductor to be measured, and the second magnetic sensor group is used for detecting a second magnetic field to be measured generated by the current flowing through the second conductor section of the current conductor to be measured. The first magnetic field to be measured and the second magnetic field to be measured constitute a differential magnetic field to be measured. The differential magnetic field to be measured is converted into a differential voltage signal by the first magnetic sensor group and the second magnetic sensor group. The differential voltage signal is processed by the signal processor and converted into an output signal that is proportional to the current to be measured and changes along with the current to be measured in real time. The output signal is output by an outgoing lead connected to the circuit board.

Further, the current conductor to be measured is a single-material metal conductor or a homogeneous alloy conductor.

Further, the cross-sectional shape of the symmetrical area of the current conductor to be measured is a rectangle, a trapezoid, a circle, or a semicircle.

Further, the first magnetic sensor group and the second magnetic sensor group are symmetrically arranged on the circuit board, and the circuit board is symmetrically distributed at one or two sides of the current conductor to be measured;

the first magnetic sensor group and the second magnetic sensor group are each composed of M magnetic sensor units arranged in parallel at intervals at one or two sides of the first conductor section, the magnetic sensor units are attached to the circuit board, and M is a positive integer; and the output signal of the first magnetic sensor group and the output signal of the second magnetic sensor group are each the mean value of converted signals of the M magnetic sensor units, and the output signal of the first magnetic sensor group and the output signal of the second magnetic sensor group constitute the differential voltage signal.

Further, the magnetic sensor unit is a Hall sensor, an anisotropic magnetic sensor, a giant magnetic sensor, or a tunneling magnetic sensor.

Further, the material of the shielding cover is permalloy, silicon steel, pure iron, magnetically conductive metal material, or an alloy.

Further, the signal processor comprises a temperature compensation unit, a nonlinear compensation unit, and an operational amplifier. The differential voltage signals converted by the first magnetic sensor group and the second magnetic sensor group sequentially pass through the temperature compensation unit, the nonlinear compensation unit, and the operational amplifier to form the output signal of the current sensor.

In the embodiments of the present invention, the current conductor to be measured of the current sensor is U shaped. The first magnetic sensor group is arranged at one or two sides of the first conductor section, and the second magnetic sensor group is arranged at one or two sides of the second conductor section, without the need for a magnetism gathering structure, resulting in a smaller overall structural size and lower cost, while significantly improving the frequency response characteristics of the current sensor. The current sensor uses the first magnetic sensor group to detect the magnetic field to be measured in the first conductor section, and uses the second magnetic sensor group to detect the magnetic field to be measured in the second conductor section. These two magnetic fields to be measured constitute the differential magnetic field to be measured, which can effectively improve the resistance of the current sensor to external magnetic field interference. The arrangement of the shielding cover can effectively weaken or even eliminate electromagnetic interference from the surrounding environment without affecting the precise detection of the current to be measured, thereby avoiding abnormal saturation of the magnetic sensor units caused by external interference, and further improving the resistance of the current sensor to external magnetic field interference. The plurality of magnetic sensor groups are arranged in the current sensor, which has a high signal-to-noise ratio and a high spatial fault tolerance, ensuring the high accuracy and low temperature drift of the current sensor in low-frequency and high-frequency current measurements. This achieves precise isolation detection of currents and expands the measurement range. The current sensor provided by the embodiments of the present invention is small in size and has strong interference immunity, a wide measurement range, low temperature drift, high frequency response, and high measurement precision.

BRIEF DESCRIPTION OF THE DRAWINGS

In order to provide a clearer explanation of the embodiments of the present invention or the technical solutions in the prior art, a brief introduction to the accompanying drawings required for the description of the embodiments or prior art will be given below. It is evident that although the accompanying drawings in the following description are specific embodiments of the present invention, for those skilled in the art, they can be expanded and extended to other structures and drawings based on the basic concepts of the device structures, driving methods, and manufacturing methods disclosed and prompted by various embodiments of the present invention, and they should undoubtedly fall within the scope of the claims of the present invention.

DETAILED DESCRIPTION

In order to make the purpose, technical solution, and advantages of the present invention clearer, the technical solution of the present invention will be described clearly and completely through implementations with reference to the accompanying drawings in the embodiments of the present invention. Obviously, the described embodiments are a portion but not all of the embodiments of the present invention. Based on the basic concepts disclosed and prompted by the embodiments in the present invention, all other embodiments obtained by those skilled in the art fall within the protection scope of the present invention.

Figure 1:
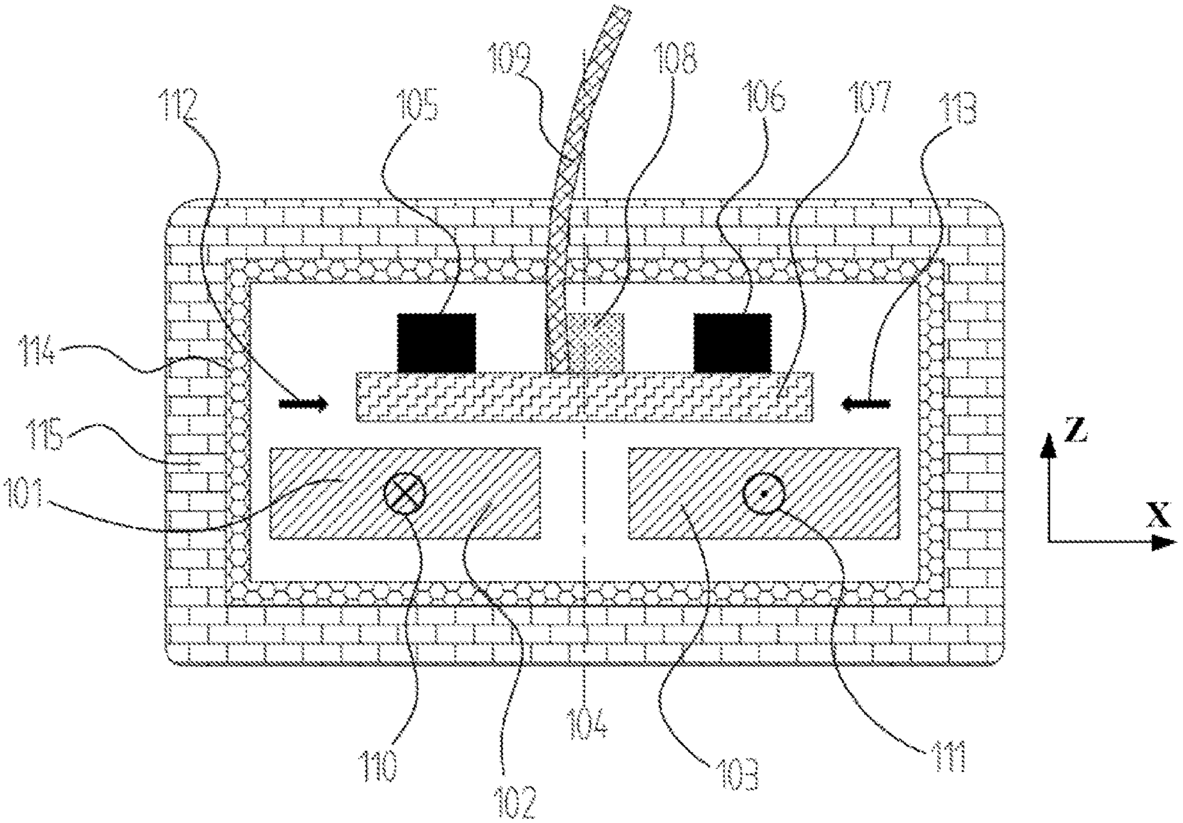
FIG. 1 is a schematic diagram of a current sensor according to an embodiment of the present invention.

Refer to FIG. 1, which is a schematic diagram of a current sensor according to an embodiment of the present invention. The current sensor provided in this embodiment comprises: a current conductor to be measured 101, wherein the current conductor to be measured 101 comprises a first conductor section 102 and a second conductor section 103 with identical shapes, the area enclosed by the extended shape of the first conductor section 102 and the second conductor section 103 is a "U" shape, and the first conductor section 102 and the second conductor section 103 are symmetrically distributed around the geometric center line 104 of the current conductor to be measured 101; a first magnetic sensor group 105 and a second magnetic sensor group 106, wherein the first magnetic sensor group 105 is arranged at one or two sides of the first conductor section 102, the second magnetic sensor group 106 is arranged at one or two sides of the second conductor section 103, the first magnetic sensor group 105 and the second magnetic sensor group 106 are symmetrically distributed around the geometric center line 104 of the current conductor to be measured 101, and the first magnetic sensor group 105 and the second magnetic sensor group 106 have the same sensing direction; a signal processor 108, a circuit board 107, and a shielding cover 114 with all sides enclosed, wherein the shielding cover 114 is placed in a housing 115 and encloses the current conductor to be measured 101, the first magnetic sensor group 105, the second magnetic sensor group 106, the signal processor 108, and the circuit board 107; and the housing 115 is made of an insulating material. After a current flows through the current conductor to be measured 101, the first conductor section 102 and the second conductor section 103 generate magnetic fields to be measured respectively at the upper and lower sides in the direction of the geometric center line 104. The magnetic fields to be measured have the same magnitude and are distributed symmetrically in opposite directions around the geometric center line 104 of the current conductor to be measured 101. The first magnetic sensor group 105 is used for detecting a first magnetic field to be measured generated by the current flowing through the first conductor section 102 of the current conductor to be measured 101, and the second magnetic sensor group 106 is used for detecting a second magnetic field to be measured generated by the current flowing through the second conductor section 103 of the current conductor to be measured 101. The first magnetic field to be measured and the second magnetic field to be measured constitute a differential magnetic field to be measured. The differential magnetic field to be measured is converted into a differential voltage signal by the first magnetic sensor group 105 and the second magnetic sensor group 106. The differential voltage signal is processed by the signal processor 108 and converted into an output signal that is proportional to the current to be measured and changes along with the current to be measured in real time. The output signal is output by an outgoing lead 109 connected to the circuit board 107.

In this embodiment, the first conductor section 102 and the second conductor section 103 have identical shapes, forming the current conductor to be measured 101 in a "U"-shaped structure.

Figure 2:
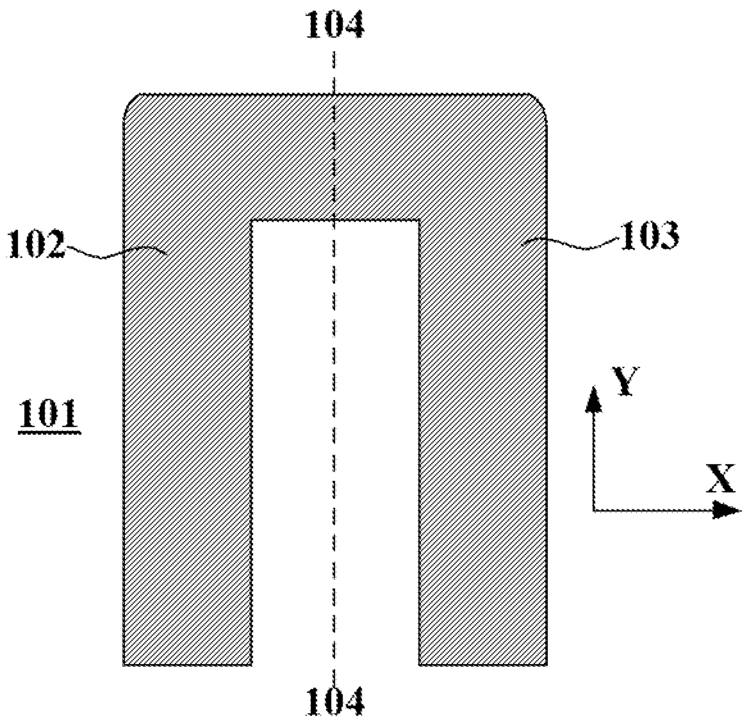
FIG. 2 is a schematic diagram of the form of a current conductor to be measured according to an embodiment of the present invention.

Refer to FIG. 2, which is a schematic diagram of the form of a current conductor to be measured according to an embodiment of the present invention. Optionally, the extended shape of the first conductor section 102 and the second conductor section 103 is an L shape, and the two form a "U"-shaped current conductor to be measured 101. The current conductor to be measured 101 has a geometric center line 104, and the first conductor section 102 and the second conductor section 103 are axially symmetrically distributed around the geometric center line 104.

Figure 3:
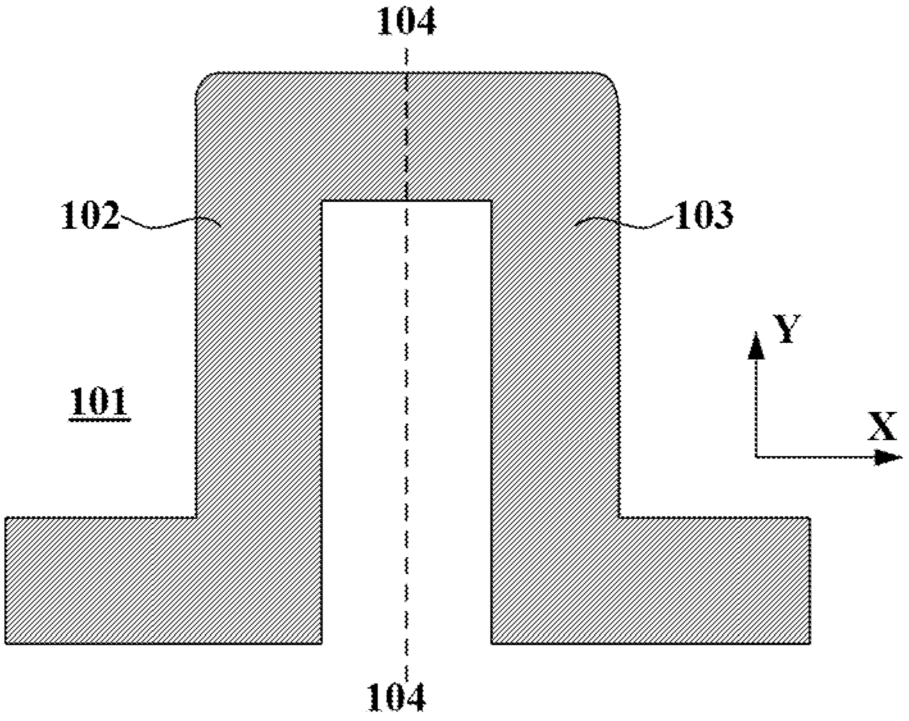
FIG. 3 is a schematic diagram of the form of another current conductor to be measured according to an embodiment of the present invention.

Refer to FIG. 3, which is a schematic diagram of the form of another current conductor to be measured according to an embodiment of the present invention. Optionally, the extended shape of the first conductor section 102 and the second conductor section 103 is similar to a Z shape, and the two form a current conductor to be measured 101 in a shape similar to a "U". The current conductor to be measured 101 has a geometric center line 104, and the first conductor section 102 and the second conductor section 103 are axially symmetrically distributed around the geometric center line 104.

One can see that the extended shape of the current conductor to be measured 101 may be a U shape or a shape similar to a U. Based on this, the first conductor section 102 and the second conductor section 103 may be reasonably selected to form the current conductor to be measured 101. Here, the first conductor section 102 and the second conductor section 103 are not two independent conductor sections, but rather parts of the current conductor to be measured 101. Specifically, if the complete current conductor to be measured 101 is virtually divided, the U-shaped current conductor to be measured 101 may be divided into a first conductor section 102 and a second conductor section 103 that are symmetrical and have identical shapes.

Taking a plane where the U-shaped current conductor to be measured 101 is located as a horizontal plane X-Y, as shown in FIG. 1, the first magnetic sensor group 105 and the second magnetic sensor group 106 are optionally arranged on the same side of the plane X-Y where the current conductor to be measured 101 is located. In a direction Z perpendicular to the plane X-Y of the current conductor to be measured 101, the first magnetic sensor group 105 overlaps the first conductor section 102 in the vertical projection of the plane X-Y where the current conductor to be measured 101 is located; that is, in the Z direction, the first magnetic sensor group 105 is located in an area above the first conductor section 102. The second magnetic sensor group 106 overlaps the second conductor section 103 in the vertical projection of the plane X-Y where the current conductor to be measured 101 is located; that is, in the Z direction, the second magnetic sensor group 106 is located in an area above the second conductor section 103.

The current sensor also comprises a circuit board 107. Optionally, the first magnetic sensor group 105 and the second magnetic sensor group 106 are each composed of one magnetic sensor unit and are symmetrically arranged on the upper surface of the circuit board 107, respectively. Specifically, the first magnetic sensor group 105 and the second magnetic sensor group 106 are arranged on the upper surface of the circuit board 107, and the circuit board 107 is located between the magnetic sensor group and the current conductor to be measured 101. The upper surface of the circuit board 107 is further provided with a signal processor 108 and an outgoing lead 109. The first magnetic sensor group 105 and the second magnetic sensor group 106 are electrically connected to the signal processor 108 and the outgoing lead 109, respectively, through the circuit board 107. The first magnetic sensor group 105 and the second magnetic sensor group 106 located on the upper surface of the circuit board 107 are also axially symmetrically distributed around the geometric center line 104 of the current conductor to be measured 101. The first magnetic sensor group 105 and the second magnetic sensor group 106 have the same sensing direction.

In other embodiments, the first magnetic sensor group may also be optionally arranged at two sides of the first conductor section, and the second magnetic sensor group may be arranged at two sides of the second conductor section.

The current conductor to be measured 101 is powered on. Specifically, the current flows into the starting terminal of the first conductor section 102, passes through the first conductor section 102 and the second conductor section 103, and then flows out from the end terminal of the second conductor section 103. As shown in FIG. 1, the direction in which the current flows into the current conductor to be measured 101 is 110, and the direction in which the current flows out of the current conductor to be measured 101 is 111. The current flows into the first conductor section 102, so that the first conductor section 102 generates a first magnetic field to be measured at two sides in the direction of the geometric center line 104. The magnetic field direction of the first magnetic field to be measured at the position of the circuit board 107 is 112. The current flows into the second conductor section 103, so that the second conductor section 103 generates a second magnetic field to be measured at two sides in the direction of the geometric center line 104. The magnetic field direction of the second magnetic field to be measured at the position of the circuit board 107 is 113. The magnetic field direction 112 of the first magnetic field to be measured and the magnetic field direction 113 of the second magnetic field to be measured have the same magnitude but opposite directions, and the two magnetic field directions are further distributed symmetrically in opposite directions around the geometric center line 104 of the current conductor to be measured 101.

The first magnetic sensor group 105 and the second magnetic sensor group 106 have the same sensing direction, both of which are the same as the magnetic field direction 112 of the first magnetic field to be measured. The first magnetic sensor group 105 may be used for detecting the first magnetic field to be measured generated by the current flowing through the first conductor section 102 of the current conductor to be measured 101, and the second magnetic sensor group 106 may be used for detecting the second magnetic field to be measured generated by the current flowing through the second conductor section 103 of the current conductor to be measured 101. The first magnetic field to be measured and the second magnetic field to be measured form a differential magnetic field to be measured. The differential magnetic field to be measured is converted into a differential voltage signal by the first magnetic sensor group 105 and the second magnetic sensor group 106.

The current sensor further comprises a signal processor 108. The signal processor 108 is electrically connected to the circuit board 107. The differential voltage signal converted and generated by the first magnetic sensor group 105 and the second magnetic sensor group 106 based on the first magnetic field to be measured and the second magnetic field to be measured is processed by the signal processor 108 and converted into an output signal that is proportional to the current to be measured and changes along with the current to be measured in real time. The output signal is output by an outgoing lead 109 connected to the circuit board 107.

The current sensor further comprises a shielding cover 114 with all sides enclosed. The shielding cover 114 is placed inside a housing 115 made of an insulating material. The shielding cover 114 encloses the current conductor to be measured 101, the first magnetic sensor group 105, the second magnetic sensor group 106, the signal processor 108, and the circuit board 107. The housing 115 made of an insulating material can enhance the electrical safety of the current sensor. One can see that only part of the internal structure of the current sensor is shown in FIG. 1. In reality, the entire internal structure of the current sensor is completely enclosed by the shielding cover 114, and the shielding cover 114 is then enclosed by the insulating housing 115. It should be noted that the outgoing lead 109 connected to the circuit board 107 is led out of the housing 115 through the shielding cover 114.

Optionally, the current conductor to be measured 101 is a single-material metal conductor or a homogeneous alloy conductor. However, it is not limited to this, and the material of the current conductor to be measured may be reasonably selected on the basis of ensuring the function of the current conductor to be measured.

Optionally, the cross-sectional shape of the symmetrical area of the current conductor to be measured 101 is a rectangle, a trapezoid, a circle, or a semicircle. That is, using an X-Z plane to cross-section the first conductor section 102 and the second conductor section 103 of the current conductor to be measured 101, the cross-sectional shape of the current conductor to be measured 101 may optionally be a rectangle, a trapezoid, a circle, or a semicircle. However, it is not limited to this, and the cross-sectional shape of the current conductor to be measured may be reasonably designed on the basis of ensuring the function of the current conductor to be measured.

Optionally, the material of the shielding cover is permalloy, silicon steel, pure iron, magnetically conductive metal material, or an alloy. However, it is not limited to this, and the material of the shielding cover may be reasonably selected on the basis of ensuring the shielding function of the shielding cover.

Optionally, the first magnetic sensor group is composed of one or a plurality of magnetic sensor units, and the second magnetic sensor group is also composed of one or a plurality of magnetic sensor units. Optionally, the magnetic sensor unit is a Hall sensor, an anisotropic magnetic sensor, a giant magnetic sensor, or a tunneling magnetic sensor. However, it is not limited to this, and the magnetic sensor units that make up the magnetic sensor group may be reasonably selected on the basis of ensuring the function of the current sensor.

Optionally, the signal processor 108 comprises a temperature compensation unit, a nonlinear compensation unit, and an operational amplifier. The differential voltage signals converted by the first magnetic sensor group 105 and the second magnetic sensor group 106 sequentially pass through the temperature compensation unit, the nonlinear compensation unit, and the operational amplifier to form the output signal of the current sensor.

In this embodiment, the signal processor 108 is electrically connected to the circuit board 107. The temperature compensation unit in the signal processor 108 performs temperature compensation on the voltage signals of the first magnetic sensor group 105 and the second magnetic sensor group 106. The nonlinear compensation unit performs nonlinear compensation on the voltage signals that have undergone temperature compensation. The operational amplifier performs gain amplification on the voltage signals that have undergone nonlinear compensation, which may ensure the high precision and low temperature drift of the current sensor and achieve precise isolation detection of the current. Optionally, the signal processor is a programmable conditioning chip, which comprises a temperature compensation unit and a nonlinear compensation unit.

In the embodiments of the present invention, the current conductor to be measured of the current sensor is U shaped. The first magnetic sensor group is arranged at one or two sides of the first conductor section, and the second magnetic sensor group is arranged at one or two sides of the second conductor section, without the need for a magnetism gathering structure, resulting in a smaller overall structural size and lower cost, while significantly improving the frequency response characteristics of the current sensor. The current sensor uses the first magnetic sensor group to detect the magnetic field to be measured in the first conductor section, and uses the second magnetic sensor group to detect the magnetic field to be measured in the second conductor section. These two magnetic fields to be measured constitute the differential magnetic field to be measured, which can effectively improve the resistance of the current sensor to external magnetic field interference. The arrangement of the shielding cover can effectively weaken or even eliminate electromagnetic interference from the surrounding environment without affecting the precise detection of the current to be measured, thereby avoiding abnormal saturation of the magnetic sensor units caused by external interference, and further improving the resistance of the current sensor to external magnetic field interference. The plurality of magnetic sensor groups are arranged in the current sensor, which has a high signal-to-noise ratio and a high spatial fault tolerance, ensuring the high accuracy and low temperature drift of the current sensor in low-frequency and high-frequency current measurements. This achieves precise isolation detection of currents and expands the measurement range. The current sensor provided by the embodiments of the present invention is small in size and has strong interference immunity, a wide measurement range, low temperature drift, high frequency response, and high measurement precision.

For example, based on the above technical solution, optionally, the first magnetic sensor group and the second magnetic sensor group are symmetrically arranged on the circuit board, and the circuit board is symmetrically distributed at one or two sides of the current conductor to be measured. The first magnetic sensor group and the second magnetic sensor group are each composed of M magnetic sensor units arranged in parallel at intervals at one or two sides of the first conductor section. The magnetic sensor units are attached to the circuit board, and M is a positive integer. The output signal of the first magnetic sensor group and the output signal of the second magnetic sensor group are each the mean value of the converted signals of the M magnetic sensor units. The output signal of the first magnetic sensor group and the output signal of the second magnetic sensor group form a differential voltage signal.

In this embodiment, optionally, the first magnetic sensor group and the second magnetic sensor group are each composed of M magnetic sensor units connected in parallel, where M is a positive integer.

As shown in FIG. 1, M=1, which means that the first magnetic sensor group 105 and the second magnetic sensor group 106 are each composed of one magnetic sensor unit, and they are symmetrically arranged on the upper surface of the circuit board 107, respectively. The first magnetic sensor group 105 and the second magnetic sensor group 106 have the same sensing direction.

Figure 4:
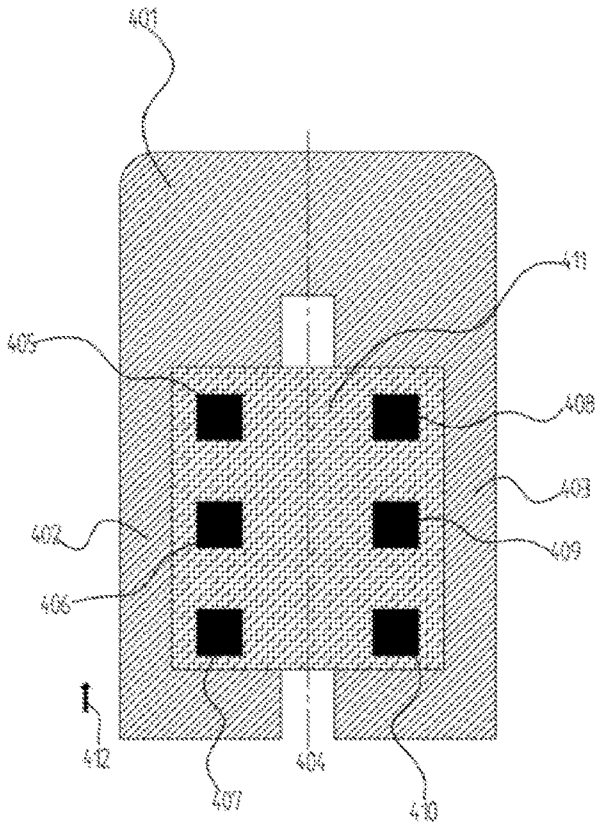
FIG. 4 is a schematic diagram of another current sensor according to an embodiment of the present invention.

Refer to FIG. 4, which is a schematic diagram of another current sensor according to an embodiment of the present invention. As shown in FIG. 4, M is greater than 1, and optionally, M=3. A first magnetic sensor group is composed of 3 magnetic sensor units 405, 406, and 407 connected in parallel, a second magnetic sensor group is composed of 3 magnetic sensor units 408, 409, and 410 connected in parallel, and they are symmetrically distributed on the upper surface of a circuit board 411 with the geometric center line 404 of a current conductor to be measured 401 as the axis. The first magnetic sensor group and the second magnetic sensor group have the same sensing direction. Specifically, the magnetic sensor units 405, 406, 407, 408, 409, and 410 have the same sensing direction.

The circuit board 411 is arranged on the upper sides of a first conductor section 402 and a second conductor section 403 that form the "U"-shaped current conductor to be measured 401. A current to be measured 412 flows into the current conductor to be measured 401 in the direction of the arrow shown in the figure and generates a first magnetic field to be measured and a second magnetic field to be measured on the upper sides of the first conductor section 402 and the second conductor section 403, respectively. The two magnetic fields to be measured have the same magnitude and opposite directions, and are symmetrically distributed around the geometric center line 404 of the current conductor to be measured 401, forming a differential magnetic field to be measured. The output signal of the first magnetic sensor group is the mean value of output signals of the three magnetic sensor units 405, 406, and 407, and the output signal of the second magnetic sensor group is the mean value of output signals of the three magnetic sensor units 408, 409, and 410. The output signal of the first magnetic sensor group and the output signal of the second magnetic sensor group form the differential magnetic field to be measured, and the differential magnetic field to be measured is converted into a differential voltage signal through the first magnetic sensor group and the second magnetic sensor group.

In this embodiment, a plurality of magnetic sensor units are arranged in a magnetic sensor group, resulting in a high signal-to-noise ratio and high spatial fault tolerance in the measurement process. This ensures the high precision and low temperature drift of the current sensor in low-frequency and high-frequency current measurements, thereby achieving precise isolation detection of currents and expanding the measurement range.

Figure 5:
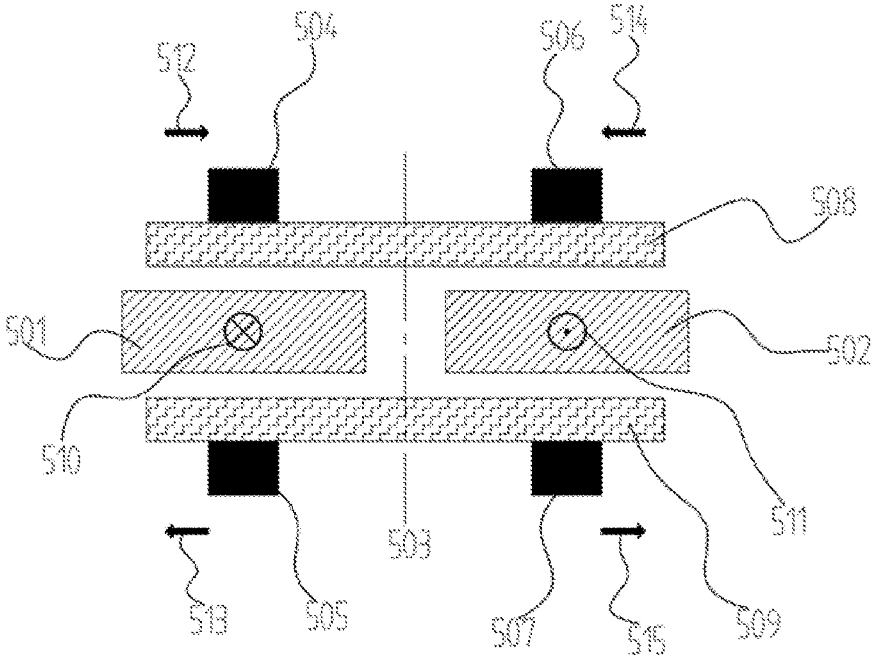
FIG. 5 is a schematic diagram of still another current sensor according to an embodiment of the present invention.

For example, on the basis of the above technical solution, the first magnetic sensor group may also be optionally arranged at two sides of the first conductor section, and the second magnetic sensor group may be arranged at two sides of the second conductor section. Refer to FIG. 5, which is a schematic diagram of still another current sensor according to an embodiment of the present invention. A difference from FIG. 1 is that in the current sensor shown in FIG. 5, the first magnetic sensor group is composed of two magnetic sensor units 504 and 505 connected in parallel, the second magnetic sensor group is composed of two magnetic sensor units 506 and 507 connected in parallel, and they are symmetrically arranged on two circuit boards 508 and 509, respectively.

As shown in FIG. 5, the current conductor to be measured comprises a first conductor section 501 and a second conductor section 502. The first conductor section 501 and the second conductor section 502 are symmetrically distributed around the geometric center line 503 of the current conductor to be measured. The two magnetic sensor units 504 and 505 in the first magnetic sensor group are located on the upper and lower sides of the plane where the first conductor section 501 is located, and the two magnetic sensor units 506 and 507 in the second magnetic sensor group are located on the upper and lower sides of the plane where the second conductor section 502 is located. The magnetic sensor units 504 and 506 have the same sensing direction, the magnetic sensor units 505 and 507 have the same sensing direction, and the magnetic sensor units 504 and 507 have opposite sensing directions.

A circuit board 508 is arranged on the upper sides of the first conductor section 501 and the second conductor section 502 that constitute the "U"-shaped current conductor to be measured, a circuit board 509 is arranged on the lower sides of the first conductor section 501 and the second conductor section 502 that constitute the "U"-shaped current conductor to be measured, and the circuit boards 508 and 509 are symmetrically arranged on the upper and lower sides of the first conductor section 501 and the second conductor section 502. Optionally, the magnetic sensor unit 504 and the magnetic sensor unit 506 are located on the upper surface of the circuit board 508, and the magnetic sensor unit 505 and the magnetic sensor unit 507 are located on the lower surface of the circuit board 509.

A current to be measured flows into the first conductor section 501 in a current direction 510, and the current to be measured generates magnetic fields to be measured 512 and 513 that are symmetric in opposite directions at the upper and lower sides of the first conductor section 501. The two magnetic fields to be measured 512 and 513 are distributed axially symmetrically around the first conductor section 501 and have the same magnitude and opposite directions, thus forming a differential magnetic field. The current to be measured flows out of the second conductor section 502 in a current direction 511, and the current to be measured generates magnetic fields to be measured 514 and 515 that are symmetric in opposite directions at the upper and lower sides of the second conductor section 502. The two magnetic fields to be measured 514 and 515 are distributed axially symmetrically around the second conductor section 502 and have the same magnitude and opposite directions, thus forming a differential magnetic field.

The magnetic fields to be measured 512&513 and the magnetic fields to be measured 514&515 are symmetrically distributed around the geometric center line 503 of the current conductor to be measured and have the same magnitude and opposite directions, thus forming a differential magnetic field to be measured. The output signal of the first magnetic sensor group is the mean value of the differential magnetic field converted signals of the two magnetic sensor units 504 and 505, and the output signal of the second magnetic sensor group is the mean value of the differential magnetic field converted signals of the two magnetic sensor units 506 and 507. The output signal of the first magnetic sensor group and the output signal of the second magnetic sensor group constitute the differential magnetic field to be measured. The differential magnetic field to be measured is converted into a differential voltage signal through the first magnetic sensor group and the second magnetic sensor group.

The current sensor provided by the embodiments of the present invention is small in size, and has strong interference immunity, a wide measurement range, low temperature drift, high frequency response, and high measurement precision. It should be noted that the above descriptions are merely the preferred embodiments and technical principles of the present invention. Those skilled in the art should understand that the present invention is not limited to the specific embodiments herein, and for those skilled in the art, various obvious variations, readjustments, combinations, and replacements may be made without departing from the protection scope of the present invention. Therefore, the present invention is described in detail through the above embodiments; but the present invention is not limited to the above embodiments, and without departing from the concepts of the present invention, other equivalent embodiments may further be included. The scope of the present invention is defined by the appended claims.

The invention claimed is:

1. A current sensor, comprising:

a current conductor to be measured, wherein the current conductor to be measured comprises a first conductor section and a second conductor section with identical shapes, the area enclosed by the extended shape of the first conductor section and the second conductor section is a "U" shape, and the first conductor section and the second conductor section are symmetrically distributed around the geometric center line of the current conductor to be measured;

a first magnetic sensor group and a second magnetic sensor group, wherein the first magnetic sensor group is arranged at one or two sides of the first conductor section, the second magnetic sensor group is arranged at one or two sides of the second conductor section, the first magnetic sensor group and the second magnetic sensor group are symmetrically distributed around the geometric center line of the current conductor to be measured, and the first magnetic sensor group and the second magnetic sensor group have the same sensing direction; and a signal processor, a circuit board, and a shielding cover that is placed in a housing and that fully encloses the current conductor to be measured, the first magnetic sensor group, the second magnetic sensor group, the signal processor, and the circuit board;

after a current flows through the current conductor to be measured, the first conductor section and the second conductor section generate magnetic fields to be measured respectively at the upper and lower sides in the direction of the geometric center line, the magnetic fields to be measured have the same magnitude and are distributed symmetrically in opposite directions around the geometric center line of the current conductor to be measured, the first magnetic sensor group is used for detecting a first magnetic field to be measured generated by the current flowing through the first conductor section of the current conductor to be measured, and the second magnetic sensor group is used for detecting a second magnetic field to be measured generated by the current flowing through the second conductor section of the current conductor to be measured, wherein the first magnetic field to be measured and the second magnetic field to be measured constitute a differential magnetic field to be measured, the differential magnetic field to be measured is converted into a differential voltage signal by the first magnetic sensor group and the second magnetic sensor group, the differential voltage signal is processed by the signal processor and converted into an output signal that is proportional to the current to be measured and changes along with the current to be measured in real time, and the output signal is output by an outgoing lead connected to the circuit board.

2. The current sensor according to claim 1, wherein the current conductor to be measured is a single-material metal conductor or a homogeneous alloy conductor.

3. The current sensor according to claim 1, wherein the cross-sectional shape of the symmetrical area of the current conductor to be measured is a rectangle, a trapezoid, a circle, or a semicircle.

4. The current sensor according to claim 1, wherein the first magnetic sensor group and the second magnetic sensor group are symmetrically arranged on the circuit board, and the circuit board is symmetrically distributed at one or two sides of the current conductor to be measured;

the first magnetic sensor group and the second magnetic sensor group are each composed of M magnetic sensor units arranged in parallel at intervals at one or two sides of the first conductor section, the magnetic sensor units are attached to the circuit board, and M is a positive integer; and the output signal of the first magnetic sensor group and the output signal of the second magnetic sensor group are each the mean value of converted signals of the M magnetic sensor units, and the output signal of the first magnetic sensor group and the output signal of the second magnetic sensor group constitute the differential voltage signal.

5. The current sensor according to claim 4, wherein the magnetic sensor unit is a Hall sensor, an anisotropic magnetic sensor, a giant magnetic sensor, or a tunneling magnetic sensor.

6. The current sensor according to claim 1, wherein the material of the shielding cover is permalloy, silicon steel, pure iron, magnetically conductive metal material, or an alloy.

7. The current sensor according to claim 1, wherein the signal processor comprises a temperature compensation unit, a nonlinear compensation unit, and an operational amplifier, and the differential voltage signals converted by the first magnetic sensor group and the second magnetic sensor group sequentially pass through the temperature compensation unit, the nonlinear compensation unit, and the operational amplifier to form the output signal of the current sensor.

* * * * *